United States Patent
Sung et al.

[11] Patent Number: 5,940,706
[45] Date of Patent: Aug. 17, 1999

[54] PROCESS FOR PREVENTING MISALIGNMENT IN SPLIT-GATE FLASH MEMORY CELL

[75] Inventors: Hung-Cheng Sung; Di-Son Kuo, both of Hsin-chu; Yai-Fen Lin, Taichung; Chia-Ta Hsieh, Tainan, all of Taiwan

[73] Assignee: Taiwan Semiconductor Manufacturing Company, Ltd, Hsin-Chu, Taiwan

[21] Appl. No.: 08/988,764

[22] Filed: Dec. 11, 1997

[51] Int. Cl.$^6$ .............................................. H01L 21/8247
[52] U.S. Cl. ...................... 438/261; 438/266; 438/401
[58] Field of Search .................................. 438/258, 261, 438/266, 267, 401

[56] References Cited

U.S. PATENT DOCUMENTS

| | | | |
|---|---|---|---|
| 5,047,816 | 9/1991 | Cuevas | 357/23.14 |
| 5,242,848 | 9/1993 | Yeh | 437/43 |
| 5,385,856 | 1/1995 | Hong | 437/43 |
| 5,408,115 | 4/1995 | Chang | 257/324 |
| 5,702,965 | 12/1997 | Kim | 438/266 |

*Primary Examiner*—Chandra Chaudhari
*Attorney, Agent, or Firm*—George O. Saile; Stephen B. Ackerman; Graham S. Jones, II

[57] ABSTRACT

A select transistor for flash memory cells is made by the following steps. Over the blanket second dielectric layer, and an oxynitride layer form a channel mask for patterning the drain and floating gate. Etch the oxynitride layer through the mask to form a channel alignment mask down to a silicon nitride layer with a drain region opening and a floating gate opening. Etch the floating gate opening through the second dielectric layer. Form a polyoxide region in the floating gate layer at the bottom of the floating gate opening by reacting the exposed portion of the floating gate layer with a reactant. Form a drain region in the substrate. Etch away the oxynitride layer and the silicon nitride layer. Pattern the floating gate electrode by etching away the floating gate layer except below the polyoxide region. Form an interelectrode dielectric layer and a second gate electrode layer over the drain region and a portion of the polyoxide region. Form a source region in the substrate self-aligned with the polyoxide region.

16 Claims, 7 Drawing Sheets

PROCESS FOR PREVENTING MISALIGNMENT IN SPLIT-GATE FLASH MEMORY CELL

BACKGROUND OF THE INVENTION

1. Field of the Invention

This invention relates to methods of manufacture of select transistors for flash memory cells and more particularly to alignment techniques employed in forming such cells.

2. Description of Related Art

The channel length of a select transistor in current split-gate flash memory cells is equal to the length of word-line (control gate electrode) minus the overlap of the word line and the floating gate electrode. Misalignment during the process of using photolithography to define a split gate electrode pattern can seriously affect the channel length and cause large variations in cell characteristics. This is the major factor which limits the scalability of split-gate flash memory cells. It is difficult to scale down due to the variability of channel length referred to hereinafter as L2.

U.S. Pat. No. 5,385,856 of Hong shows a method of forming a fieldles split gate.

U.S. Pat. No. 5,047,816 of Cuebas shows a self-aligned dual gate transistor method.

U.S. Pat. No. 5,408,115 of Chang and U.S. Pat. No. 5,242,848 of Yeh show other self-aligned methods.

SUMMARY OF THE INVENTION

An object of this invention is to avoid the variation of select transistor channel length caused by misalignment during the photolithographic process.

Another object of this invention is to provide a select transistor that has a drain junction self-aligned to the floating gate.

In addition, this invention relates to a process of forming a drain junction which can be self-aligned with the floating gate.

A very important aspect of this invention is to perform the drain implant before depositing the second polysilicon layer, so that the distance between the drain region and the polysilicon oxide layer implant persists after the second polysilicon layer is formed into the control gate electrode.

A method of forming a device with a source region, a drain region, a channel in a semiconductor substrate covered with a first dielectric layer, floating gate electrode formed from a blanket floating gate layer, a blanket second dielectric layer, an interelectrode dielectric layer and a control gate electrode above the interelectrode dielectric layer located between the source region and the the drain region, comprises the following steps. Form a sacrificial layer over the blanket second dielectric layer. Cover the sacrificial layer with a channel mask with openings therethrough in the pattern of the drain region and the floating gate electrode of the device. Etch the sacrificial layer through the openings through the channel mask to form therefrom a channel alignment mask with channel openings therethrough down to the blanket second dielectric layer, the channel openings including a drain region opening therethrough in the pattern of the drain region and a floating gate opening therethrough in the pattern of the floating gate electrode of the device. Etch the floating gate opening through the floating gate opening through the second dielectric layer. Form a third dielectric region in the blanket floating gate layer at the bottom of the floating gate opening by reacting the exposed portion of the blanket floating gate layer with a reactant. Form a doped drain region in the substrate through the drain region opening through the blanket second dielectric layer. Etch away the sacrificial layer and the second dielectric layer. Pattern the floating gate electrode by etching away the blanket floating gate layer except below the third dielectric region. Form an interelectrode dielectric layer and a second gate electrode layer over the drain region and a portion of the third dielectric region. Form a doped source region in the substrate by ion implantation self-aligned with the third dielectric region.

Preferably, the sacrificial layer is composed of oxynitride; the second dielectric layer is composed of silicon nitride; the sacrificial layer is composed of oxynitride; and the second dielectric layer is composed of silicon nitride. The third dielectric region is composed of polysilicon oxide from polysilicon in the blanket floating gate layer. The sacrificial layer is composed of oxynitride, the second dielectric layer is composed of silicon nitride, and the third dielectric region is composed of polysilicon oxide from polysilicon in the blanket floating gate layer. The drain region is formed by ion implantation of arsenic through the drain region opening.

The sacrificial layer is composed of oxynitride, the second dielectric layer is composed of silicon nitride, the third dielectric region is composed of polysilicon oxide from polysilicon in the blanket floating gate layer, and the drain region is formed by ion implantation of arsenic through the drain region opening. The source region is formed by ion implantation of arsenic.

The sacrificial layer is composed of oxynitride, the second dielectric layer is composed of silicon nitride, the third dielectric region is composed of polysilicon oxide from polysilicon in the blanket floating gate layer, the drain region is formed by ion implantation of arsenic through the drain region opening, and the source region is formed by ion implantation of arsenic.

In accordance with another aspect of this invention, this is a method of forming a device with a source region, a drain region, a channel in a semiconductor substrate covered with a silicon oxide layer, a floating gate electrode formed from a blanket floating gate doped polysilicon layer, a blanket silicon nitride layer, an interelectrode dielectric layer and a control gate electrode above the interelectrode dielectric layer located between the source region and the the drain region, comprises the following steps. Form a sacrificial layer over the blanket silicon nitride layer. Cover the sacrificial layer with a channel mask with openings therethrough in the pattern of the drain region and the floating gate electrode of the device. Etch the sacrificial layer through the openings through the channel mask to form therefrom a channel alignment mask with channel openings therethrough down to the blanket silicon nitride layer, the channel openings including a drain region opening therethrough in the pattern of the drain region and a floating gate opening therethrough in the pattern of the floating gate electrode of the device. Etch the floating gate opening through the floating gate opening through the second dielectric layer. Form a polysilicon oxide region in the blanket floating gate layer at the bottom of the floating gate opening by reacting the exposed portion of the blanket floating gate doped polysilicon layer with a reactant. Form a mask over the polysilicon oxide region. Form a doped drain region in the substrate by ion implantation through the drain region opening through the blanket silicon nitride layer. Remove the mask from the polysilicon oxide region. Etch away the sacrificial layer. Etch away the silicon nitride layer. Pattern the floating gate electrode by etching away the blanket floating gate layer except below the polysilicon oxide region. Form an interelectrode dielectric layer and a second gate electrode layer composed of doped polysilicon over the drain region and a portion of the polysilicon oxide region. Form a doped source region in the substrate by ion implantation self-aligned with the polysilicon oxide region. The sacrificial layer is composed of oxynitride. The drain region is formed by ion implantation of arsenic through the drain region opening. The source region is formed by ion implantation of arsenic. The sacrificial layer is composed of oxynitride, the drain region is formed by ion implantation of arsenic through the drain region opening. The sacrificial layer is composed of oxynitride, the drain region is formed by ion implantation of arsenic through the drain region opening, and the source region is formed by ion implantation of arsenic.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

To achieve the object of this invention which is to form a drain junction which can be self-aligned to the floating gate, the process of this invention uses an additional film deposition and two extra masks providing a reliably accurate distance L2 determined by the channel mask which patterns both the drain region and the floating gate electrode.

Process Flow

Figure 1A:
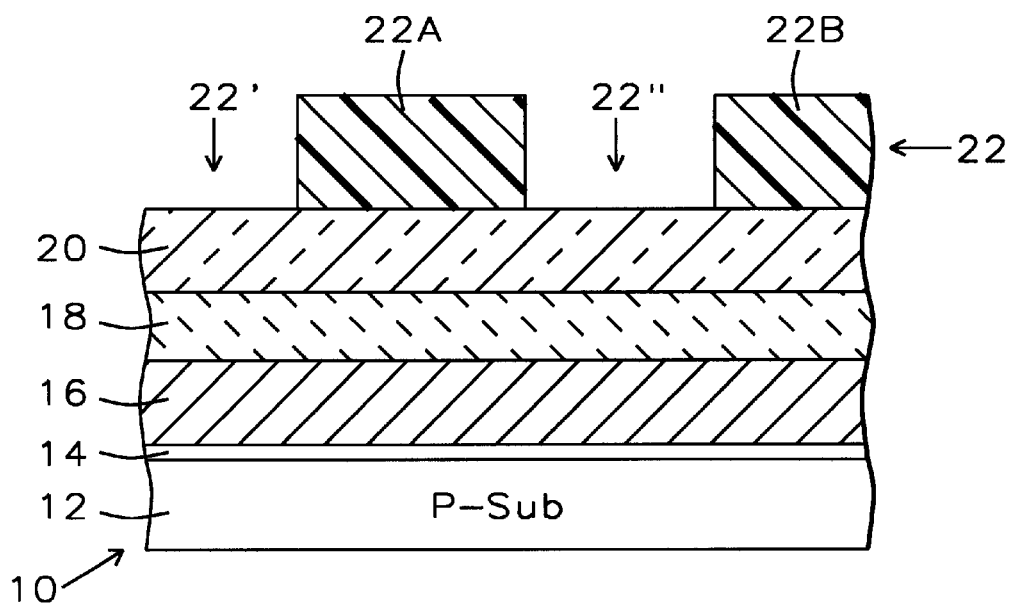
FIGS. 1A–1K shows the process flow in accordance with this invention for manufacture of a select transistor as shown in FIG. 1K.
Figure 1B:
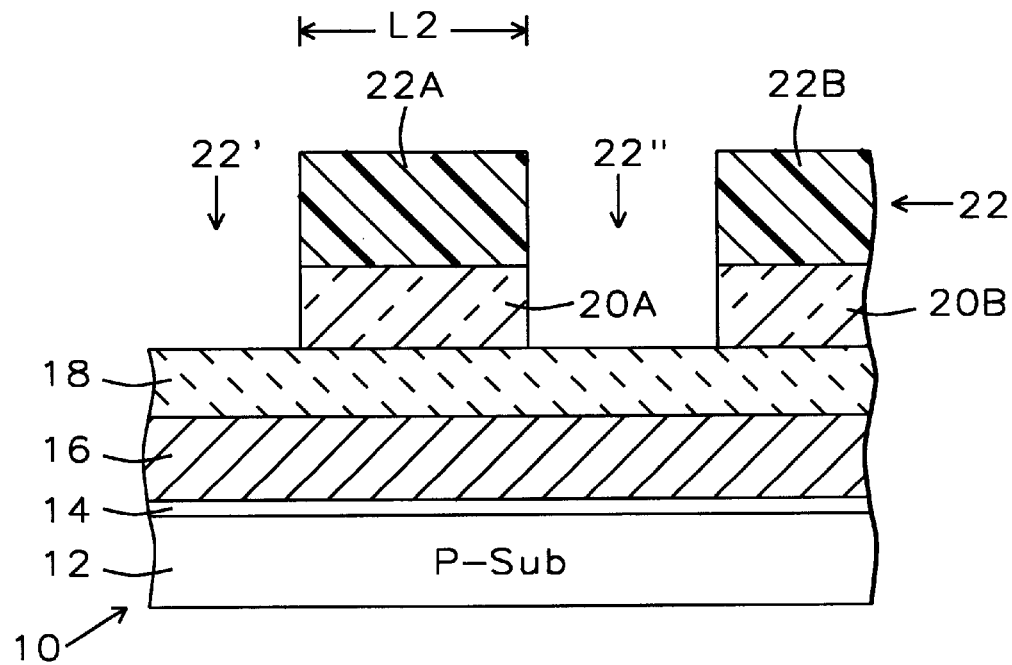
Figure 1C:
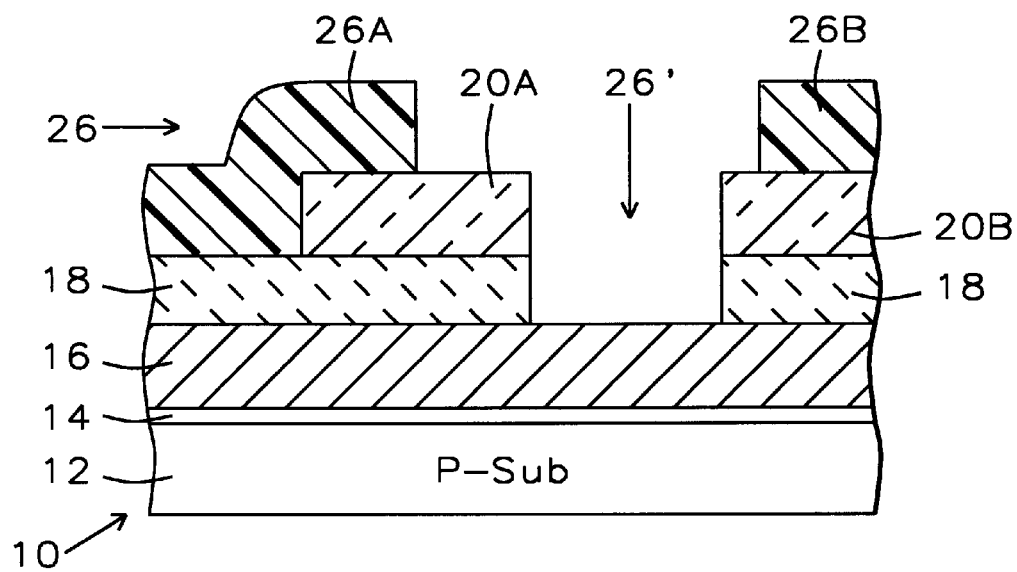
Figure 1D:
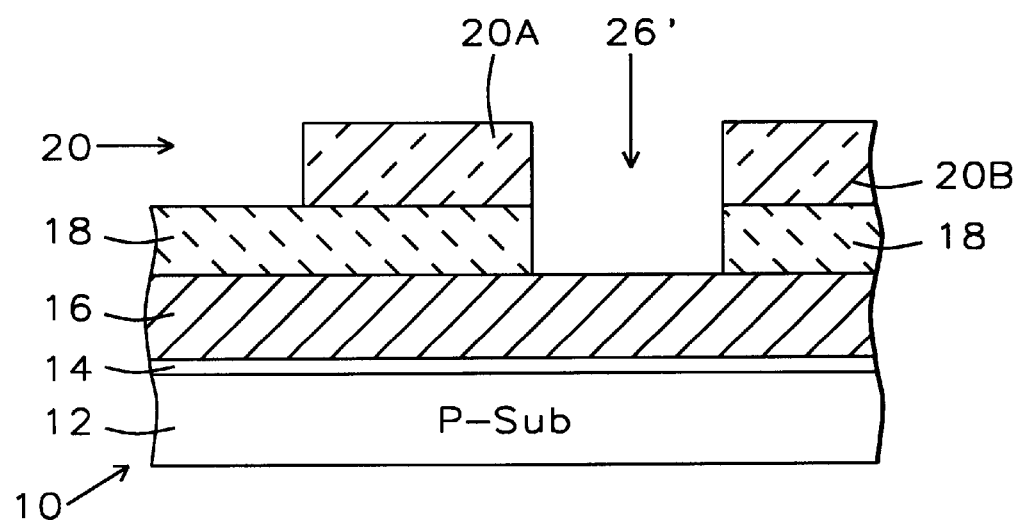
Figure 1E:
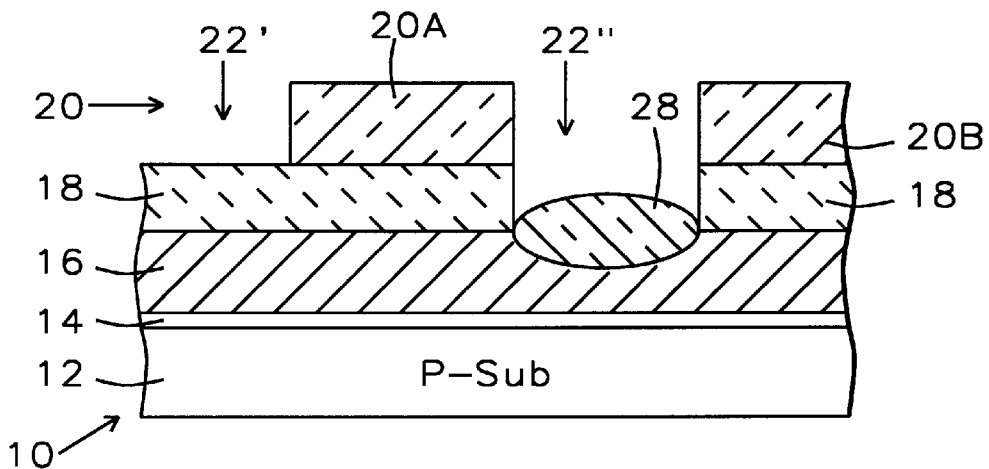
Figure 1F:
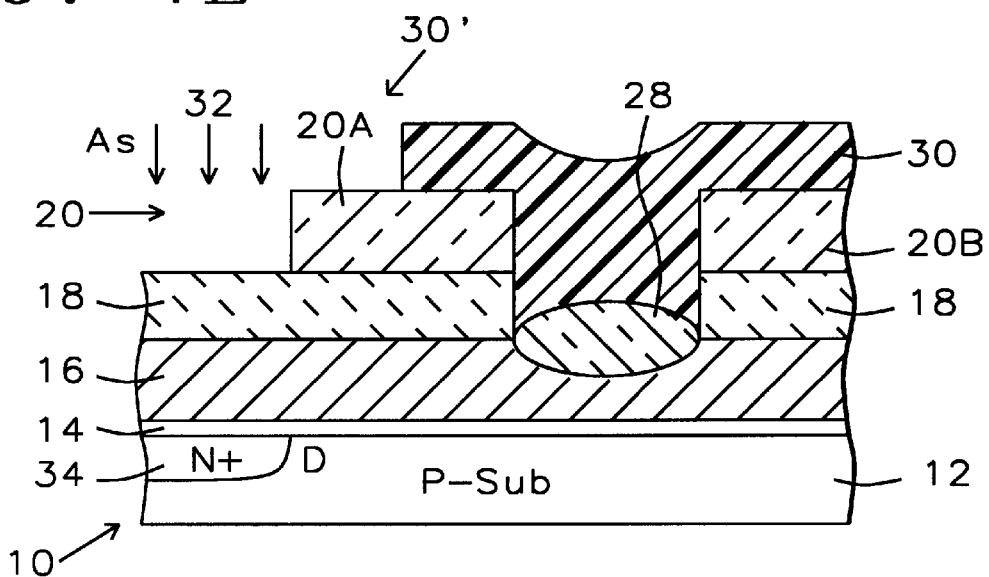
Figure 1G:
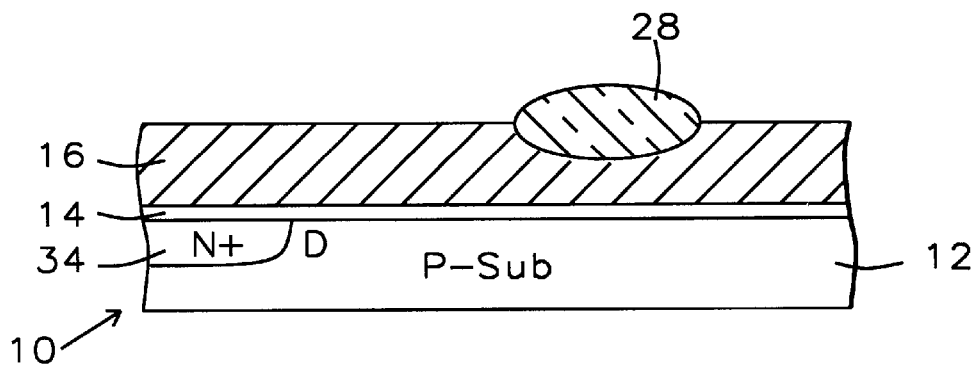
Figure 1H:
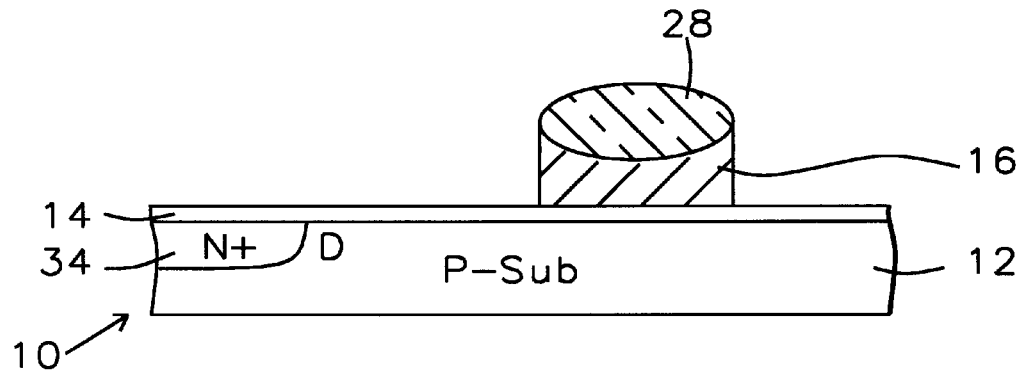
Figure 1I:
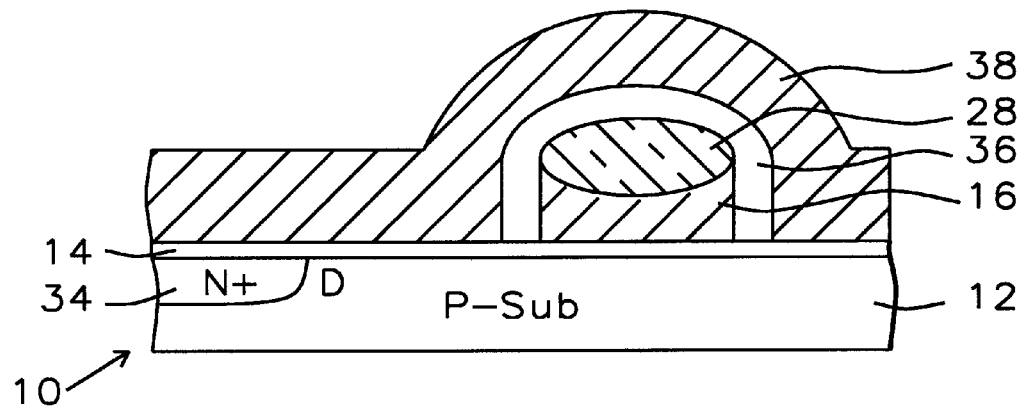
Figure 1J:
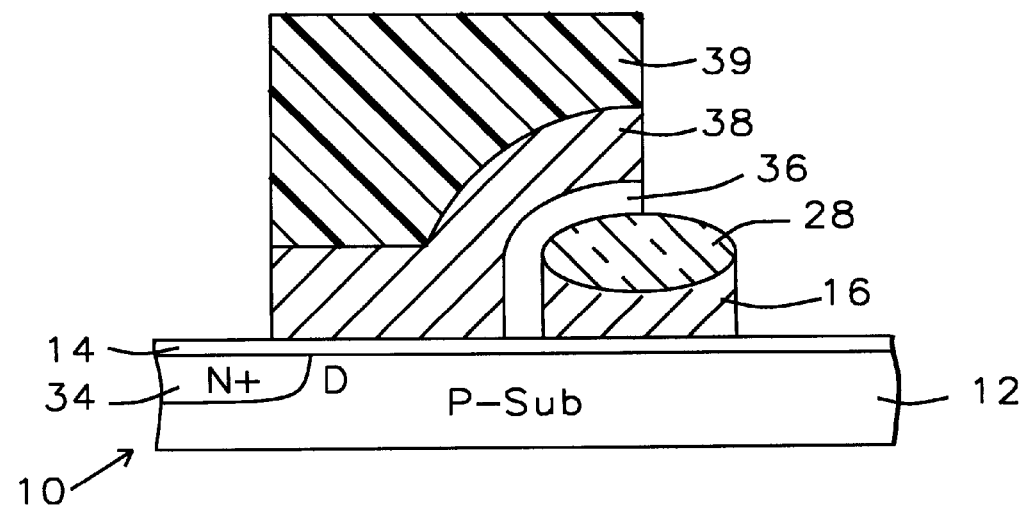
Figure 1K:
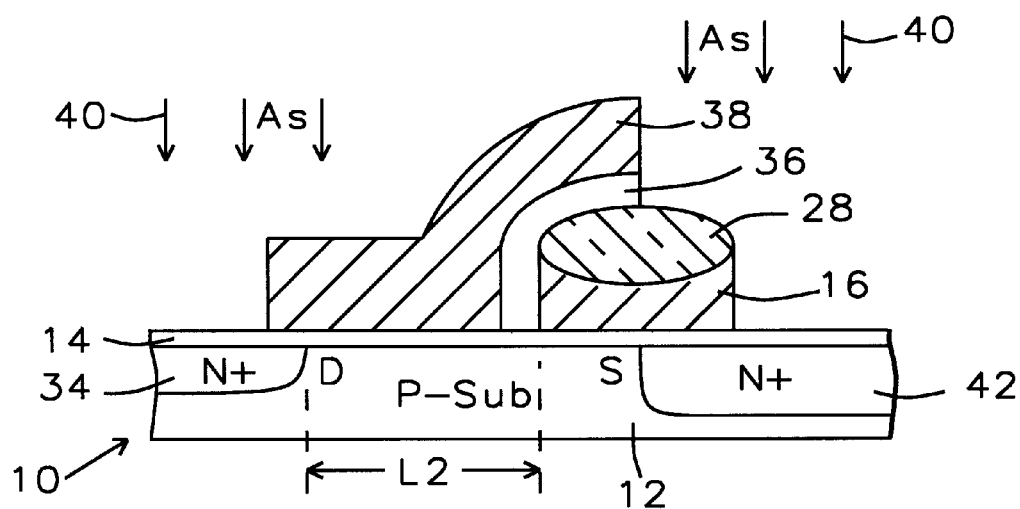

FIGS. 1A–1k shows the process flow in accordance with this invention for manufacture of a select transistor as shown in FIG. 1K.

FIG. 1A shows a fragmentary elevational view of a device 10 which is to be formed into the split gate MOSFET device 10 seen in FIG. 1K, in an early stage of manufacture. The device 10 includes a silicon semiconductor substrate 12 covered with a thin dielectric layer, preferably a tunnel oxide (silicon oxide) layer 14 with a thickness from about 80 Å to about 120 Å. A doped first polysilicon layer 16 with a thickness from about 1500 Å to about 2000 Å was formed over the tunnel oxide layer 14. Then a silicon nitride ($Si_3N_4$) layer 18 with a thickness from about 1000 Å to about 1500 Å was deposited on the doped polysilicon layer 16. Next, a sacrificial masking, oxynitride ($SiO_xN_y$) layer 20 with a thickness from about 1000 Å to about 1500 Å was deposited on the silicon nitride ($Si_3N_4$) layer 18. Above the layer 20, a photoresist, channel mask 22 has been formed with a pattern with drain region opening 22' and polysilicon oxide floating-gate-electrode (polysiliconoxide) opening 22" therethrough. A sacrificial masking, oxynitride layer 20 can be grown by CVD. The channel mask 22 includes mask segment 22A the left and mask segment 22B on the right with drain-region opening 22' located to the left of mask segment 22A and the floating-gate-electrode (polysilicon-oxide) floating-gate-electrode (polysilicon-oxide) opening 22" located between mask segment 22A and mask segment 22B.

FIG. 1B shows the device 10 of FIG. 1A after a step of etching portions of a sacrificial masking, oxynitride layer 20 through the drain region opening 22' and the floating-gate-electrode (polysilicon-oxide) opening 22" through the channel mask 22 forming channel-length mask 20. The width of the channel of MOSFET device 10 will be the length L2 of the mask segment 22A of channel mask 22 (i.e. the length along the horizontal (x) axis between the drain region opening 22' and the floating-gate-electrode (polysilicon-oxide) opening 22"). In accordance with this invention, the ultimate channel length of device 10 as seen in FIG. 1K is controlled by this masking step. The width of the sacrificial masking, oxynitride segment 20A equals the length L2.

FIG. 1C shows the device 10 of FIG. 1B upon which a second photoresist mask 26 has been formed over the device 10 with a floating-gate-electrode (polysilicon-oxide) opening 26' therethrough covering the remainder of the segment of device 10 seen in FIG. 1C. The opening 26' is provided for etching silicon nitride ($Si_3N_4$) layer 18 to extend opening 26' down to the surface of polysilicon layer 16 to prepare to form a polysilicon oxide region 28 for patterning the floating gate electrode 16, as shown in FIGS. 1E–1H.

FIG. 1D shows the device 10 of FIG. 1C after the second photoresist mask 26 (including sections 26A and 26B) has been stripped from device 10.

FIG. 1E shows the device 10 of FIG. 1D after oxidation of the the portion of first polysilicon layer 16 exposed through floating-gate-electrode opening 22" forming polysilicon-oxide region 28 (with an elliptical cross section) between sections 20A and 20B of oxynitride, channel alignment mask 20.

The polysilicon-oxide region 28 is formed by thermal oxidation in an atmosphere of oxygen and hydrogen at a temperature from about 850° C. to about 950° C.

FIG. 1F shows the device 10 of FIG. 1E after formation of third photoresist mask 30 over the polyoxide region 28 and over much of the sections 20A and 20B of oxynitride, channel alignment mask 20. FIG. 1F also shows the device 10 during drain implantation of an N+ doped drain region 34 through drain-region opening 22'. The drain region 34 is being ion implanted with a dose of arsenic dopant from about 3 E 15 ions/cm$^2$ to about 4 E 15 ions/cm$^2$ at an energy from about 40 keV to about 50 keV. After annealing the concentration of arsenic dopant in the drain region 34 was from about 1 E 20 atoms/cm$^3$ to about 1 E 21 atoms/cm$^3$.

FIG. 1G shows the device 10 of FIG. 1F after stripping away as follows:
1. third photoresist mask 30,
2. sections 20A and 20B of oxynitride, channel alignment mask 20 and
3. silicon nitride ($Si_3N_4$) layer 18, exposing the surface of the polysilicon-oxide region 28 and the surface of the remainder of the first polysilicon layer 16, so that the polysilicon-oxide region 28 forms a floating gate electrode mask thereover.

FIG. 1H shows the device 10 of FIG. 1G after etching away the first polysilicon layer 16 except below the polysilicon-oxide region 28 which has served as a mask to pattern the layer 16 into a floating gate electrode. Aside from the first polysilicon layer 16, the surface of the silicon oxide layer 14 is exposed including the portion above the N+ doped drain region 34.

FIG. 1I shows the device 10 of FIG. 1H after depositing a thin film of an interpolysilicon (interconductor) dielectric (ONO) layer 36 with a thickness from about 230 Å to about 280 Å. Layer 36 is preferably composed of ONO although other dielectric materials can be employed.

Above ONO layer 36 is formed a second polysilicon layer 38 with a thickness from about 2000 Å to about 3000 Å. Layer 38 is to be patterned into a control gate electrode.

FIG. 1J shows the device 10 of FIG. 1I after the fourth photoresist mask 39 has been formed over device 10 and used to etch away the portions of layers 36 and 38 which are unprotected to form a split gate, control gate electrode 38.

FIG. 1K shows the device 10 of FIG. 1J after the fourth photoresist mask 39 has been stripped away and the N+ doped source region 42 is being doped by ion implanted with a dose of phosphorus dopant from about 3 E 15 ions/cm$^2$ to about 5 E 15 ions/cm$^2$ at an energy from about 40 keV to about 60 keV. After annealing the concentration of arsenic dopant in the source region 42 was from about 1 E 19 atoms/cm$^3$ to about 1 E 20 atoms/cm$^3$.

In FIG. 1K, the channel length L2 of select transistor 10 is shown between the drain region 34 and the leading edge of the floating gate electrode 16. This distance L2 is determined by the channel mask 22 and the channel length mask 20 in FIG. 1B, as well as seen in FIGS. 1F and 1G. Channel length mask 20 has the parameter of length L2 in a single mask. The location of mask 39 and the control gate electrode 38 does not affect the alignment.

Illustration of Processing Problem Solved

Figure 2A:
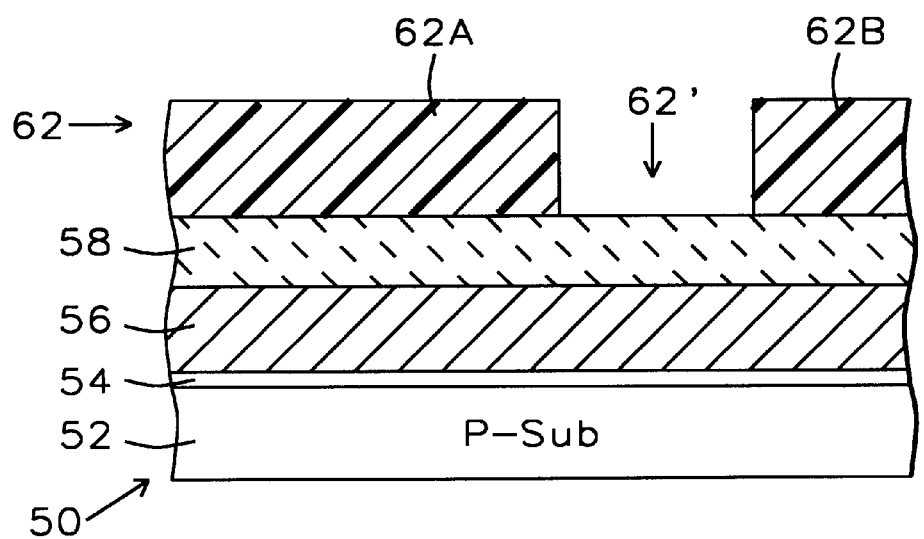
FIGS. 2A–2F show an alternative process flow for manufacture of a select transistor as shown in FIG. 2F.
Figure 2B:
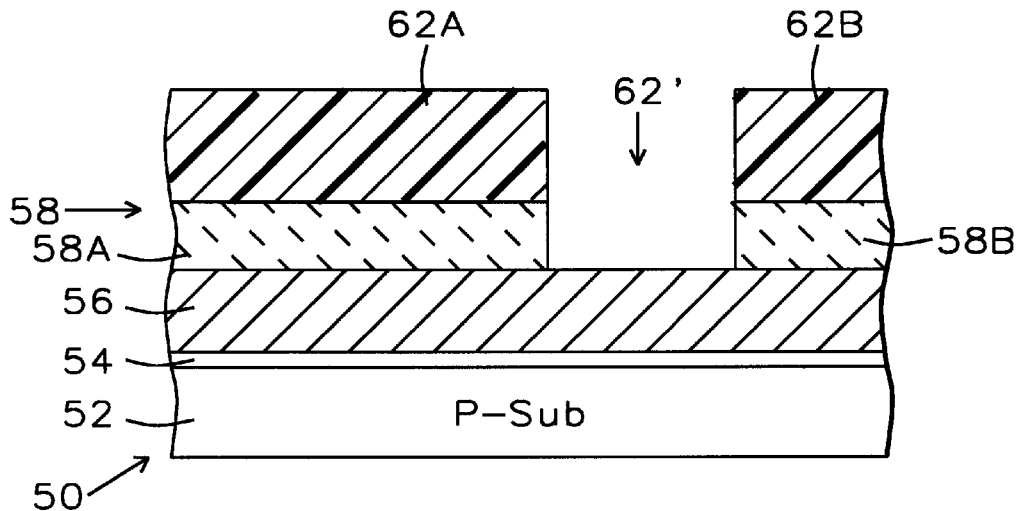
Figure 2C:
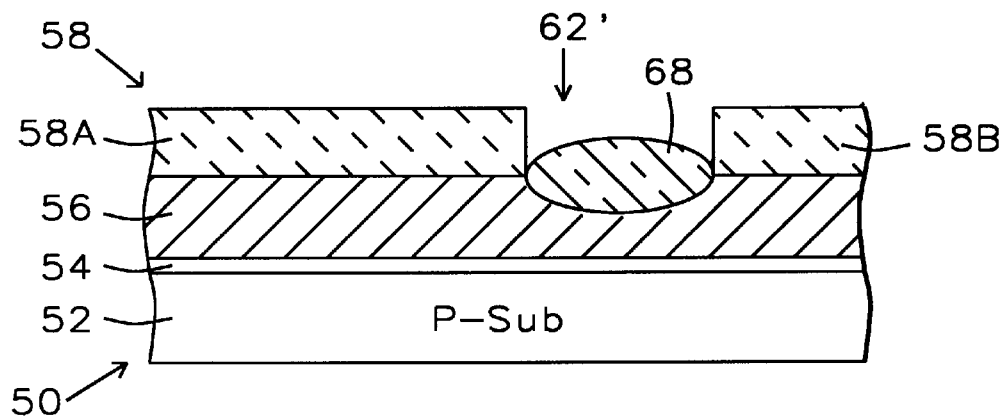
Figure 2D:
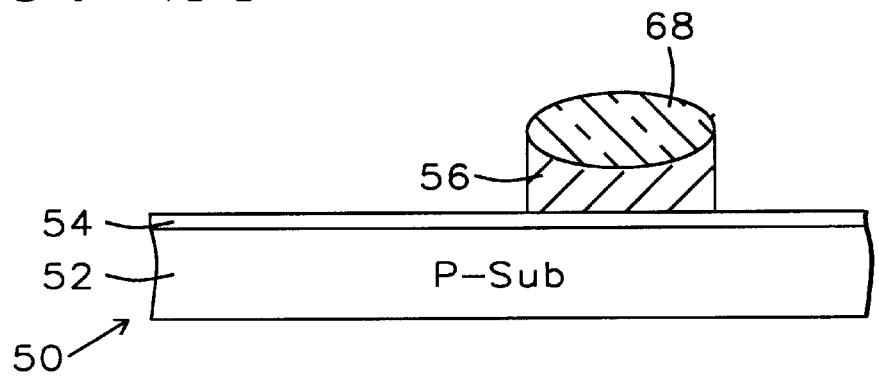
Figure 2E:
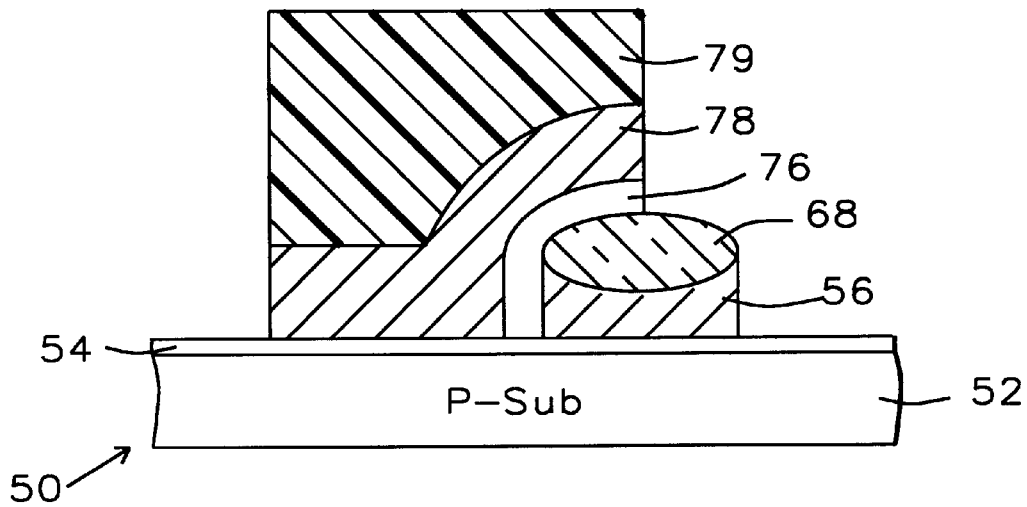
Figure 2F:
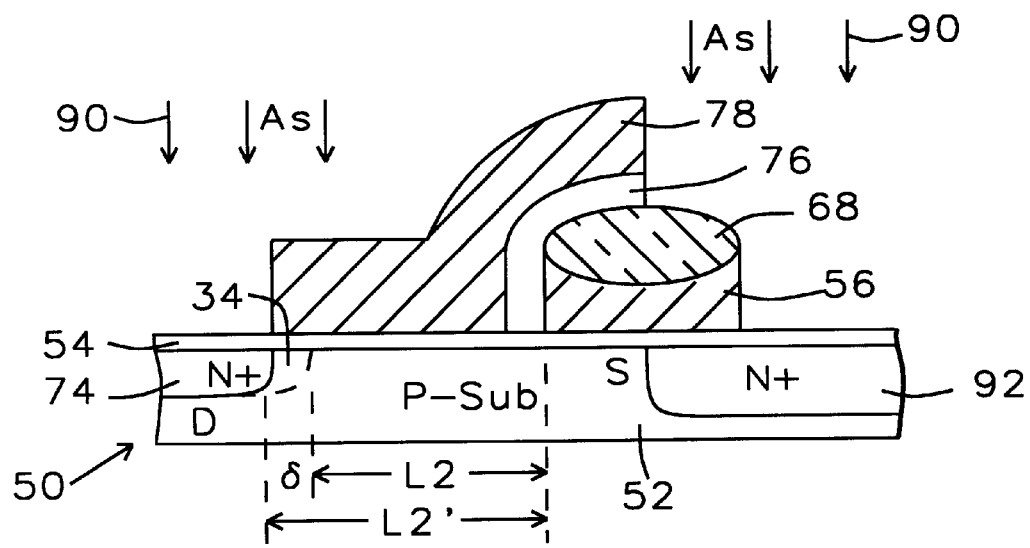

FIGS. 2A–2F show a process flow for manufacture of a select transistor as shown in FIG. 2F. The approach exemplified here uses a self-aligned approach to forming the source/drain regions adjacent to the split gate electrode stack. This results in greater degree of variation in the length of the channel of the device as shown below.

FIG. 2A shows a fragmentary elevational view of a device 50 which is to be formed into the split gate MOSFET device 50 seen in FIG. 2F, in an early stage of manufacture. The device 50 includes a silicon semiconductor substrate 52 covered with a thin dielectric layer, preferably a tunnel oxide (silicon oxide) layer 54. A doped first polysilicon layer 56 was formed over the tunnel oxide layer 54. Then a silicon nitride (Si$_3$N$_4$) layer 58 was deposited on the doped polysilicon layer 56. Above layer 56, a photoresist, floating gate mask 62 has been formed with a polysilicon oxide floating-gate-electrode (polysilicon-oxide) opening 62' therethrough between sections 62A and 62B of mask 62.

FIG. 2B shows the device 50 of FIG. 2C after etching silicon nitride (Si$_3$N$_4$) layer 58 through opening 62' in photoresist floating-gate-electrode mask 62' to extend a floating-gate-electrode (polysilicon-oxide) opening 62' therethrough covering the remainder of the segment of device 50 seen in FIG. 2B extending opening 62' down between sections 58A and 58B of silicon nitride (Si$_3$N$_4$) layer 58 to the surface of polysilicon layer 56 to prepare to form the floating gate electrode, as shown in FIGS. 2C–2D.

FIG. 2C shows the device 50 of FIG. 2B after the photoresint mask 62 (including sections 62A and 62B) has been stripped from device 50.

FIG. 2C also shows the device 50 after oxidation of the the portion of first polysilicon layer 56 exposed through floating-gate-electrode opening 62' forming polysilicon-oxide region 68 (with an elliptical cross section) between sections 58A and 58B of silicon nitride (Si$_3$N$_4$) layer 59.

FIG. 2D shows the device 50 of FIG. 2C after stripping away sections 58A and 58 of silicon nitride (Si$_3$N$_4$) layer 58, exposing the surface of the remainder of the first polysilicon layer 56, so that the polysilicon-oxide region 68 forms a floating gate electrode mask thereover. FIG. 2D also shows the device 50 after etching away the first polysilicon layer 56 except below the polysilicon-oxide region 68 which has served as a mask to pattern the layer 56 into a floating gate electrode. Aside from the first polysilicon layer 56, the surface of the silicon oxide layer 54 is exposed. Note that no drain region has been formed at this point in the process from FIGS. 2A–2D.

FIG. 2E shows the device 50 of FIG. 2D after depositing a thin film of an interpolysilicon (interconductor) dielectric (ONO) layer 76. Above ONO layer 76 is formed a second polysilicon layer 78. Unprotected portions of layers 76 and 78 have been patterned by mask 79 to form a split gate, control gate electrode 78 in the pattern of control gate mask 78.

FIG. 2F shows the device 50 of FIG. 2E after the photoresist mask 78 has been stripped away and the N+ doped drain region 74 and the source region 92 have been doped by a self-aligned ion implantation process with a dose of arsenic dopant.

There is shown in FIG. 2F, in phantom, the location of drain region 34 in FIG. 1K a distance L2 from the floating gate electrode 56. The distance of L2' is the length of the channel in the device of FIG. 2F, with a gap of "δ" between the two. The gap of delta prevents the achievement of the Critical Dimension (CD) which is required in the current state of the art. Accordingly, the present invention overcomes the problem exemplified by the kind of process shown in FIGS. 2A–2F, which difference manifests the advantage of the formation of the drain region with the initial mask alignment rather than using a self-aligned ion implantation as in FIG. 2F.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of forming a device with a source region, a drain region, a channel in a semiconductor substrate covered with a first dielectric layer, floating gate electrode formed from a blanket floating gate layer, a blanket second dielectric layer, an interelectrode dielectric layer and a control gate electrode above said interelectrode dielectric layer located between said source region and said said drain region, said method comprising the steps as follows:

forming a sacrificial layer over said blanket second dielectric layer, covering said sacrificial layer with a channel mask with openings therethrough in the pattern of said drain region and said floating gate electrode of said device, etching said sacrificial layer through said openings through said channel mask to form therefrom a channel alignment mask with channel openings therethrough down to said blanket second dielectric layer, said channel openings including a drain region opening therethrough in the pattern of said drain region and a floating gate opening therethrough in the pattern of said floating gate electrode of said device, etching said floating gate opening through said floating gate opening through said second dielectric layer, forming a third dielectric region in said blanket floating gate layer at the bottom of said floating gate opening by reacting the exposed portion of said blanket floating gate layer with a reactant, forming a doped drain region in said substrate through said drain region opening through said blanket second dielectric layer, etching away said sacrificial layer and said second dielectric layer, patterning said floating gate electrode by etching away said blanket floating gate layer except below said third dielectric region, forming an interelectrode dielectric layer and a second gate electrode layer over said drain region and a portion of said third dielectric region, and forming a doped source region in said substrate by ion implantation self-aligned with said third dielectric region.

2. A method in accordance with claim 1 wherein said sacrificial layer is composed of oxynitride.

3. A method in accordance with claim 1 wherein said second dielectric layer is composed of silicon nitride.

4. A method in accordance with claim 1 wherein said sacrificial layer is composed of oxynitride, and said second dielectric layer is composed of silicon nitride.

5. A method in accordance with claim 1 wherein said third dielectric region is composed of polysilicon oxide from polysilicon in said blanket floating gate layer.

6. A method in accordance with claim 1 wherein said sacrificial layer is composed of oxynitride, said second dielectric layer is composed of silicon nitride, and said third dielectric region is composed of polysilicon oxide from polysilicon in said blanket floating gate layer.

7. A method in accordance with claim 1 wherein said drain region is formed by ion implantation of arsenic through said drain region opening.

8. A method in accordance with claim 1 wherein said sacrificial layer is composed of oxynitride, said second dielectric layer is composed of silicon nitride, said third dielectric region is composed of polysilicon oxide from polysilicon in said blanket floating gate layer, and said drain region is formed by ion implantation of arsenic through said drain region opening.

9. A method in accordance with claim 1 wherein said source region is formed by ion implantation of arsenic.

10. A method in accordance with claim 1 wherein said sacrificial layer is composed of oxynitride, said second dielectric layer is composed of silicon nitride, said third dielectric region is composed of polysilicon oxide from polysilicon in said blanket floating gate layer, said drain region is formed by ion implantation of arsenic through said drain region opening, and said source region is formed by ion implantation of arsenic.

11. A method of forming a device with a source region, a drain region, a channel in a semiconductor substrate covered with a silicon oxide layer, a floating gate electrode formed from a blanket floating gate doped polysilicon layer, a blanket silicon nitride layer, an interelectrode dielectric layer and a control gate electrode above said interelectrode dielectric layer located between said source region and said said drain region, said method comprising the steps as follows:

forming a sacrificial layer over said blanket silicon nitride layer, covering said sacrificial layer with a channel mask with openings therethrough in the pattern of said drain region and said floating gate electrode of said device, etching said sacrificial layer through said openings through said channel mask to form therefrom a channel alignment mask with channel openings therethrough down to said blanket silicon nitride layer, said channel openings including a drain region opening therethrough in the pattern of said drain region and a floating gate opening therethrough in the pattern of said floating gate electrode of said device, etching said floating gate opening through said floating gate opening through said second dielectric layer, forming a polysilicon oxide region in said blanket floating gate layer at the bottom of said floating gate opening by reacting the exposed portion of said blanket floating gate doped polysilicon layer with a reactant, forming a mask over said polysilicon oxide region, forming a doped drain region in said substrate by ion implantation through said drain region opening through said blanket silicon nitride layer, removing said mask from said polysilicon oxide region, etching away said sacrificial layer, etching away said silicon nitride layer, patterning said floating gate electrode by etching away said blanket floating gate layer except below said polysilicon oxide region, forming an interelectrode dielectric layer and a second gate electrode layer composed of doped polysilicon over said drain region and a portion of said polysilicon oxide region, and forming a doped source region in said substrate by ion implantation self-aligned with said polysilicon oxide region.

12. A method in accordance with claim 11 wherein said sacrificial layer is composed of oxynitride.

13. A method in accordance with claim 11 wherein said drain region is formed by ion implantation of arsenic through said drain region opening.

14. A method in accordance with claim 11 wherein said source region is formed by ion implantation of arsenic.

15. A method in accordance with claim 11 wherein said sacrificial layer is composed of oxynitride, said drain region is formed by ion implantation of arsenic through said drain region opening.

16. A method in accordance with claim 11 wherein said sacrificial layer is composed of oxynitride, said drain region is formed by ion implantation of arsenic through said drain region opening, and said source region is formed by ion implantation of arsenic.

* * * * *